US010454244B2

(12) United States Patent
Telford et al.

(10) Patent No.: US 10,454,244 B2
(45) Date of Patent: Oct. 22, 2019

(54) DRIVER CIRCUITRY AND SYSTEMS FOR HIGH CURRENT LASER DIODE ARRAYS

(71) Applicant: Lawrence Livermore National Security, LLC, Livermore, CA (US)

(72) Inventors: Steven J. Telford, Livermore, CA (US); Andrew James Bayramian, Manteca, CA (US); Glenn Beer, Manteca, CA (US); Robert J. Deri, Pleasanton, CA (US); Edward S. Fulkerson, Livermore, CA (US); Charles L. Heinbockel, Walnut Creek, CA (US); Edward S. Koh, Livermore, CA (US); Rodney Kay Lanning, Pleasanton, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 15/673,202

(22) Filed: Aug. 9, 2017

(65) Prior Publication Data

US 2019/0052051 A1 Feb. 14, 2019

(51) Int. Cl.
*H01S 5/042* (2006.01)
*H01S 5/0683* (2006.01)
(Continued)

(52) U.S. Cl.
CPC .......... *H01S 5/042* (2013.01); *H01S 5/02469* (2013.01); *H01S 5/06835* (2013.01); *H01S 5/4025* (2013.01)

(58) Field of Classification Search
CPC ...... H01S 5/042; H01S 5/0427; H01S 5/0428; H01S 5/06835; H01S 5/4025–4093
See application file for complete search history.

(56) References Cited

U.S. PATENT DOCUMENTS 5,337,323 A * 8/1994 Rokugawa ............ H01S 5/0683
372/29.015
6,739,728 B2 5/2004 Erbert et al.
(Continued)

FOREIGN PATENT DOCUMENTS

CA 2772710 C 8/2018
CN 102640368 A 8/2012
(Continued)

OTHER PUBLICATIONS

Bishop, B., "Lawrence Livermore deploys world's highest peak power laser diode arrays," Lawrence Livermore National Laboratory, Mar. 12, 2015, 5 pages.
(Continued)

*Primary Examiner* — Joshua King
(74) *Attorney, Agent, or Firm* — Perkins Coie LLP

(57) ABSTRACT

Apparatuses, methods, and systems are disclosed to drive pumping laser diode arrays. In implementations, an integrated system can be constructed to in a compact, efficient and cost-effective manner and to meet the needs of driving laser diode arrays in various diode pumped solid state laser applications. The disclosed implementations include individual laser diode drivers or pulsers, methods of communicating with laser diode drivers, and methods of controlling the pulse shape of each laser diode driver.

10 Claims, 14 Drawing Sheets

(51) Int. Cl.
*H01S 5/024* (2006.01)
*H01S 5/40* (2006.01)

(56) References Cited

U.S. PATENT DOCUMENTS

| | | | |
|---|---|---|---|
| 6,760,356 B2 | 7/2004 | Erbert et al. | |
| 6,897,424 B2* | 5/2005 | Suzuki | H04B 10/077 |
| | | | 250/205 |
| 7,187,819 B1* | 3/2007 | Silveira | H04B 10/806 |
| | | | 385/16 |
| 8,284,809 B2 | 10/2012 | Armstrong et al. | |
| 8,554,072 B2* | 10/2013 | Oomori | H04B 10/40 |
| | | | 398/135 |
| 8,660,156 B2 | 2/2014 | Telford et al. | |
| 9,178,334 B2 | 11/2015 | Flukerson, Jr. | |
| 9,391,698 B1* | 7/2016 | Urata | H04B 10/0779 |
| 9,711,943 B2 | 7/2017 | Telford | |
| 9,972,969 B2 | 5/2018 | Flukerson et al. | |
| 2002/0126724 A1* | 9/2002 | Tsunekane | H01S 3/0941 |
| | | | 372/69 |
| 2003/0086453 A1* | 5/2003 | Nolan | H01S 5/02423 |
| | | | 372/35 |
| 2004/0095853 A1* | 5/2004 | Masui | G11B 7/0062 |
| | | | 369/13.24 |
| 2004/0165629 A1* | 8/2004 | Iwakura | H01S 3/0941 |
| | | | 372/38.02 |
| 2005/0018726 A1* | 1/2005 | Dinger | H01S 5/40 |
| | | | 372/38.09 |
| 2005/0047457 A1* | 3/2005 | Shibuya | G11B 7/126 |
| | | | 372/38.02 |
| 2007/0160098 A1* | 7/2007 | Morimoto | H01S 3/0941 |
| | | | 372/38.09 |
| 2008/0205900 A1 | 8/2008 | Cole et al. | |
| 2009/0010651 A1 | 1/2009 | Prater | |
| 2010/0316072 A1* | 12/2010 | Deladurantaye | G06F 1/0321 |
| | | | 372/29.02 |
| 2013/0114632 A1* | 5/2013 | Telford | H01S 5/0428 |
| | | | 372/38.02 |
| 2013/0136448 A1* | 5/2013 | Hinderthur | H04B 10/272 |
| | | | 398/63 |
| 2015/0036707 A1* | 2/2015 | Fulkerson, Jr. | H01S 5/0428 |
| | | | 372/38.01 |
| 2015/0139661 A1 | 5/2015 | Aronson et al. | |
| 2015/0372451 A1* | 12/2015 | Fulkerson | H01S 5/0427 |
| | | | 372/35 |
| 2016/0087749 A1* | 3/2016 | Lawin | H04Q 11/0066 |
| | | | 398/49 |
| 2016/0192450 A1 | 6/2016 | Catalano et al. | |
| 2019/0052051 A1 | 2/2019 | Telford et al. | |

FOREIGN PATENT DOCUMENTS

| | | |
|---|---|---|
| EP | 2462665 A1 | 6/2012 |
| EP | 2777106 A1 | 9/2014 |
| EP | 2962537 A1 | 1/2016 |
| IN | 2236DEN2012 A | 8/2015 |
| JP | 2013504214 A | 2/2013 |
| JP | 2016512652 A | 4/2016 |
| KR | 101721282 A | 3/2017 |
| RU | 2012112805 A | 10/2013 |
| WO | 02054650 A2 | 7/2002 |
| WO | 2011028932 A1 | 3/2011 |
| WO | 2013070683 A1 | 5/2013 |
| WO | 2014134340 A1 | 9/2014 |

OTHER PUBLICATIONS

Wallace, J., "Laser Pump Sources: Four 800 kW laser-diode arrays to pump high-pulse-rate HAPLS petawatt laser," LaserFocusWorld, Apr. 28, 2015, 3 pages.

International Search Report and Written Opinion received in the International Patent Application No. PCT/US2018/046785 filed Aug. 14, 2018.

Extended European Search Report dated Jul. 10, 2015, received in a patent application No. 12847385.7, 5 pages.

\* cited by examiner

| Parameters | Value |
|---|---|
| Minimum Pulse current | 100A |
| Maximum Pulse current | 1000A |
| Amplitude resolution | 1A |
| Amplitude Accuracy | < 1% |
| Pulse Width Minimum | 20µs |
| Pulse Width Maximum | 350µs |
| Pulse Width Resolution | 1µs |
| Pulse Width Accuracy | <50ns |
| Pulse Rise Time | <15µs |
| Pulse Fall Time | <2µs |
| Pulse shape control | Controlled by an Internal Arbitrary Waveform Generator (AWG) |
| Efficiency | >85% (Depending on load) |
| Maximum Operating Voltage | 125VDC |
| Size | 25.4mm(H) x 45mm(W) x 412.75mm(D) |
| Method of Cooling | Conduction to the case |
| Overcurrent Protection | Programmable with a resistor |
| Pulse Width Protection | Built in at 350µs |
| Rep Rate Protection | Programmable via external control |
| Command Interface | Optical data stream |
| House Keeping Power | <5W at 24VDC |

FIG. 4

| Parameters | Value |
|---|---|
| Length | 2 meters (Depends on load) |
| Resistance | <1 milliohms/per foot |
| Inductance | <10 nanohenries/per foot |
| Pluggable | Yes |

FIG. 7

DRIVER CIRCUITRY AND SYSTEMS FOR HIGH CURRENT LASER DIODE ARRAYS

STATEMENT REGARDING FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

TECHNICAL FIELD

This present disclosure is related to arrays of laser diodes and diode pumped solid state lasers.

BACKGROUND

High power solid-state lasers are used in various industrial and other applications. In some applications, solid-state lasers are pumped by other solid-state laser sources such as laser diodes. Some solid-state lasers are pumped by several laser diodes that are coordinated to properly pump the solid-state laser. Conventional means of controlling the pumping laser diodes can pose challenges in maintaining high efficiency and reliability.

SUMMARY

The technology disclosed in this patent document includes specific implementations in form of apparatuses, methods, and systems for driving pumping laser diode arrays. Specifically, the disclosed technology can be implemented to construct an integrated system in a compact, efficient and cost-effective manner and to meet the needs of driving laser diode arrays in various diode pumped solid state laser applications.

In one aspect, an apparatus for operating a laser diode array is disclosed. The apparatus may include a plurality of driver circuits mounted to a fixture, wherein each driver circuit supplies electrical power to a different laser diode in the laser diode array. The apparatus may further include one or more cooling plates coupled to the plurality of driver circuits, wherein each driver circuit is coupled to a top surface or a bottom surface of the one or more cooling plates to dissipate heat from each driver circuit through the coupled cooling plate.

The following features may be included in any combination. The apparatus may further include one or more cables to electrically couple an associated driver with an associated laser diode, wherein the one or more cables have a low inductance. Each of the one or more cables may include a male MULTILAM connector that is polarized to cause each of the one or more cables to be installed in a single orientation. Each of the one or more cables may have a resistance of 1 milliohm per foot or less, and/or an inductance of 10 nanohenries per foot or less. Each of the one or more cables may include a coaxial wire. The apparatus may further include a plurality of energy storage modules to store energy for pulsing an associated laser diode.

In another aspect, an apparatus for controlling a laser diode array is disclosed. The apparatus may include a plurality of controllers to control a current wave shape or a current amplitude driven into each laser diode in the laser diode array, wherein each laser diode has an associated controller, wherein each controller adjusts the current wave shape or the current amplitude according to a command. The apparatus may further include a plurality of optical receivers coupled to the plurality of controllers. The plurality of optical receivers may be configured to receive the command. The command may be a broadcast command to control the plurality of controllers together, or an addressed command to control one of the plurality of controllers.

The apparatus for controlling a laser diode array may include any of the following features in any combination. Each of the plurality of controllers may be configured to at least: receive feedback information relating to a measured current into an associated laser diode and/or a measured optical output from the associated laser diode. The plurality of controllers may be further configured to upon detecting an anomaly in the measured current or a measured optical output, adjust the current amplitude or wave shape via a command, or shutting down one or more of the plurality of driver circuits. The plurality of controllers may be further configured to send the command to control the current amplitude or wave shape into the associated laser diode. The wave shape may be adjusted in at least one of: a rise time of a pulse, a fall time of the pulse, an amplitude of the pulse, and/or a width of the pulse. Each of the plurality of controllers is configured to at least monitor data from one or more sensors included in the apparatus. The monitored data from the one or more sensors may include at least one of: a diode coolant temperature, a diode flow switch status, a diode humidity, a pulser coolant flow rate, a pulser outlet temperature, and/or a voltage provided by a direct current power supply. The apparatus may further include one or more processors and memory, wherein the one or more processors is further configured to communicate via an Ethernet interface. The one or more processors may be a NATIONAL INSTRUMENT (NI) CRIO processor with an integrated field programmable gate array.

In another aspect, a method for controlling a laser diode array is disclosed. The method may include controlling, by a plurality of controllers, a current wave shape or a current amplitude driven into each laser diode in the laser diode array, wherein each laser diode has an associated controller, wherein each controller adjusts the current wave shape or the current amplitude according to a command. The method may further include receiving, by a plurality of optical receivers coupled to the plurality of controllers, the command, wherein the command is a broadcast command to control the plurality of controllers together, or an addressed command to control one of the plurality of controllers.

The method for controlling the laser diode array may include the following features in any combination. Each of the plurality of controllers may be configured to at least receive feedback information relating to a measured current into the associated laser diode and a measured optical output from the associated laser diode. The plurality of controllers may be further configured to upon detecting an anomaly in the measured current or a measured optical output, adjusting the current amplitude or wave shape a command, or shutting down one or more of the plurality of driver circuits. The method may further include sending the command to control the current amplitude or wave shape into an associated laser diode. The wave shape may be adjusted in at least one of: a rise time of a pulse, a fall time of the pulse, an amplitude of the pulse, and a width of the pulse.

BRIEF DESCRIPTION OF THE DRAWINGS

FIG. 4 depicts an example of a table with operational parameters for a laser diode driver circuit, in accordance with some example embodiments.

FIG. 7 depicts a table of example characteristics of a cable for driving a laser diode, in accordance with some example embodiments.

Where possible, like reference numbers refer to the same or similar features in the drawings.

DETAILED DESCRIPTION

Figure 1A:
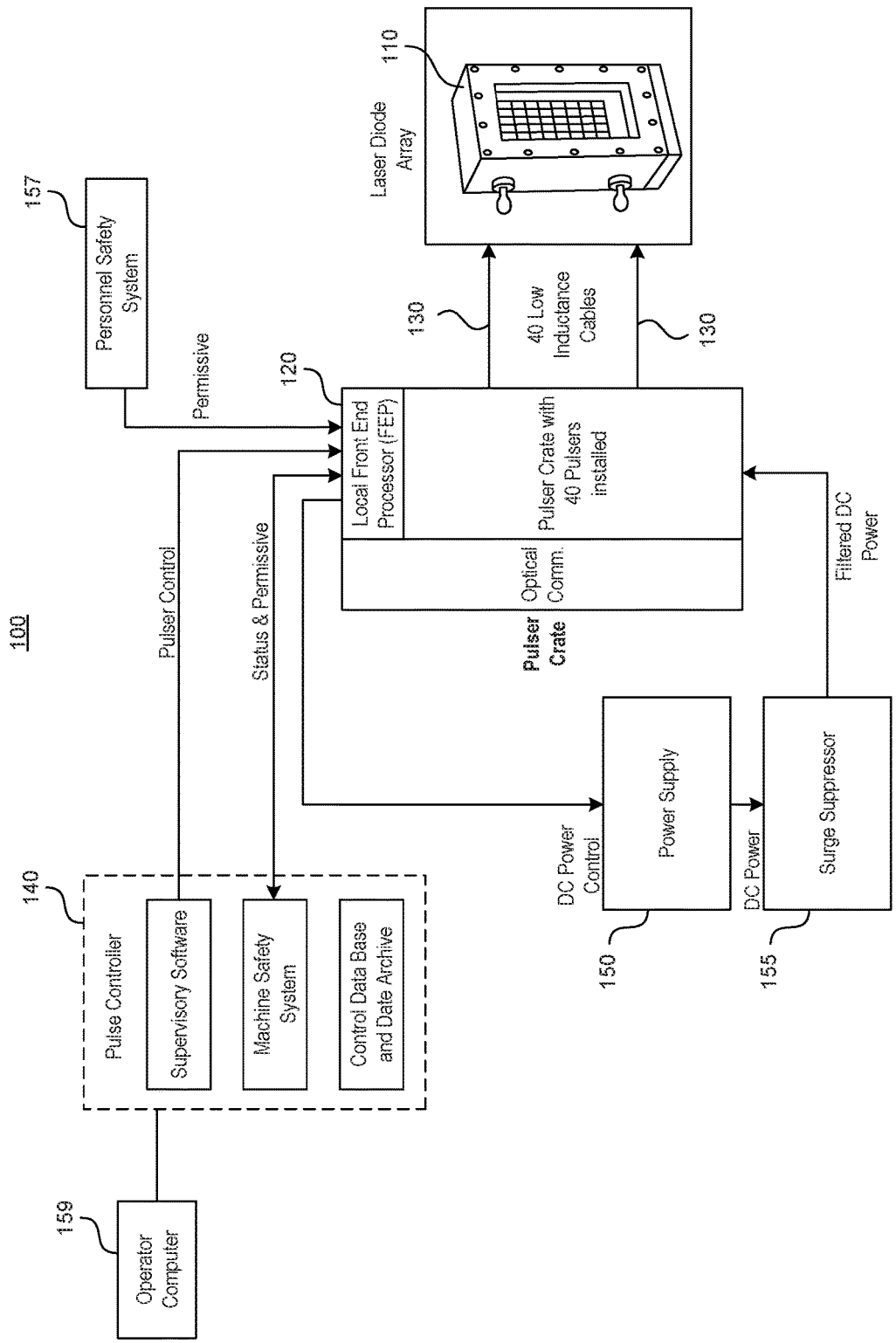
FIG. 1A depicts an example of a laser system including a laser diode array and laser diode driver electronics, in accordance with some example embodiments.

In applications based on diode pumped solid state lasers, there is a need to drive the pumping diode arrays in a compact, efficient and cost-effective manner. This document discloses designs and methods for meeting the needs of driving laser diode arrays in a diode pumped solid state laser application. The disclosed technology can be implemented to provide individual laser diode drivers or pulsers, methods of communicating with laser diode drivers, and methods of controlling the pulse shape of each laser diode driver and methods of mounting, cooling, and controlling high average power diode arrays.

Laser diode arrays may have different numbers of laser diodes organized in an array (e.g., also referred to herein as tiles) and may have a frontal area where the diode array produces light of a predetermined size (e.g., 400 square cm). Each laser diode in the array may require a predetermined current pulse having a current amplitude (e.g., 1000 Ampres) and a predetermined current wave shape as a function of time.

Current technology requires large rack-mounted equipment which have limited current driving capabilities and occupy a large volume (e.g., 150,000 cubic centimeters of space). The disclosed technology provides many advantages including compact driver circuits, efficient cooling, reduced cable losses, control of the driver for each laser diode, and control of multiple diode arrays. In some embodiments, the volume of the laser power conditioning system can be decreased by a factor of 10, allowing the power conditioning to be located near the diode array, which allows for the use of shorter cabling, thereby allowing the diode arrays to be driven to higher currents with better-shaped, high current pulses. Also disclosed is a controller for the laser system including laser drivers to allow control of the electrical current including current amplitude and wave shape for each laser diode.

The laser diodes which also may be referred to as semiconductor lasers, semiconductor laser diodes, or tiles may be placed in an array. For example, a laser diode array may include an array of laser diodes that is 5 laser diodes by 8 laser diodes in a rectangular array of forty laser diodes. Any other number of laser diodes may be placed in a rectangular array or any other shape of array as well.

Devices, methods, and systems are disclosed that are associated with high peak power laser diode arrays to pump solid-state lasers (also referred to herein as a Diode Pumped Solid State Laser (DPSSL)). For example, a laser diode array may pump a high repetition-rate advanced petawatt laser system (HAPLS). Also disclosed are laser diode drivers and controllers that may drive/control each of the laser diodes in the laser diode array.

In some example embodiments, an array of laser diodes is driven by an array of driver circuits. The driver circuits may also be referred herein as pulsers. The light from the laser diodes may pump a solid-state laser, and the solid state laser may also produce laser light for use in industrial equipment, communications, or any other device requiring laser light at the wavelength(s) produced by the solid-state laser. The laser diodes may also be used to pump other types of lasers such as gas lasers, or any other type of laser.

Some embodiments disclosed herein provide methods and devices for mounting and cooling driver circuits that are used to drive each of the laser diodes in the laser diode array. For example, each laser diode may be driven by a different laser diode driver (pulser). Multiple laser diode drivers may be cooled by a cooler. Also disclosed is a controller for controlling the laser diode array. Some embodiments include a high-efficiency, low loss cable for coupling each laser diode to a corresponding laser diode driver circuit. Further disclosed is a controller for controlling one or more diode arrays including laser diode driver circuits for each laser diode array.

FIG. 1A depicts an example of a laser system 100 including a laser diode array and laser diode driver electronics, in accordance with some example embodiments. In some example embodiments, the laser diode driver circuits associated with a laser diode array may be referred to herein as a power conditioning system. The power conditioning system is scalable from one laser diode driver circuit to fifty, or any other number of diode driver circuits. Multiple power conditioning systems and diode arrays may be combined to produce large peak power outputs (e.g., one or more megawatts) for pumping high-power solid-state lasers or for industrial equipment, communications, or any other purpose.

FIG. 1A depicts a single laser diode array 110 coupled to a pulser crate 120 via low-loss cables 130. Multiple laser diode drivers are incorporated into pulser crate 120 and pulser crate 120 includes a cooling apparatus to reduce the operating temperature of the included laser diode driver circuits. Each laser diode driver circuit drives a laser diode in the array via a low-loss cable 130. In some example embodiments, the laser diode array may include 40 laser diodes arranged in a rectangular array. In some example embodiments, each tile (laser diode) in the array, may occupy a frontal area of 1 cm×2 cm. Because the frontal area occupied by a diode array is small, the disclosed power conditioning system must be compact so that it does not dominate the overall size of the laser diode array system including the laser diode drivers and cooling.

Each tile in the laser diode array can consume a large pulse current during operation (e.g., 1000 Amps). In some implementations, a diode array can include 40 individual diode tiles arranged in a 5×8 array. In some example embodiments, each tile in the array can generate 20 kilowatts of peak power. In some embodiments, each diode array may generate 2.4 kilowatts of average power and 800 kilowatts of peak power.

In some implementations, the cables between the laser diode driver circuits and each laser diode in the laser diode array are connected with low-loss cables 130. Low-loss cables 130 may have low resistance to reduce losses due to the resistance of the cables and improve power efficiency. Low-loss cables 130 may be low inductance to prevent changes in current wave shape and thus the wave shape of the light produced by the laser diode due to energy stored in magnetic fields of the cable inductance. In the example shown in FIG. 1A, 40 low inductance cables are used to couple the pulsers to the laser diodes in the diode array. In some laser diode driver implementations, laser diode driver cabling may have resistances in the range of multiple milliohms/foot and 10's of nanohenries per foot. In implementations of the disclosed technology in this disclosure, A laser diode driver cable may be designed to have a reduced resistance per foot and/or the inductance per foot, thus reducing ohmic loss and the associated and undesired heat. In some example embodiments, the resistance per foot may be less than 1 milliohm/foot and/or the inductance per foot may be less than 10 nanohenries/foot. In some example embodiments, pulse shaping may tune out the inductance in the cables and allow for faster rise and fall times without overshoot. The reduction in resistance and/or inductance may reduce the losses and allow for better shaping of the pulse. The pulse shaping circuit may tune out the effects of any remaining resistance and/or inductance.

The electronic drive to each tile in the diode array is provided individually, the light generated by the laser diode tiles in the array is part of the an overall light generating system. Different laser diode tiles in the array may be different in some ways from one another, e.g., emitting a slightly different amount of energy per unit of drive current that is applied from one or more other laser diode tiles in the array. Due to the differences in the laser diode tiles in the array, the drive currents for different laser diode tiles may be modified/controlled on a tile-by-tile basis to achieve a desired overall optical output from the different laser diode tiles of the array, e.g., substantially uniform or even optical power levels from the different laser diode tiles in the array. In some example embodiments, the laser diode tiles may be triggered at the same time or nearly the same time to produce a current pulse delivered to each laser diode in the laser diode array at the same or nearly the same time to produce light output from the laser diodes in the array that at the same or nearly the same time. In some example embodiments, one or more of the laser diode driver circuits can be made to operate with one or more of the attributes depicted in the table in FIG. 4.

In implementing the laser system 100 in FIG. 1A, the pulse controller 140 provides pulser waveform attributes to the pulsers in pulser crate 120. In some example embodiments, the pulse controller provides 140 an interface to an operator computer or a user interface for setting/configuring pulser waveform attributes such as the attributes depicted in FIG. 4. In some embodiments, the pulse controller 140 can be coupled to a database for storing/archiving pulse attributes for one or more laser diode drivers and/or data related to the performance of the pulsers and/or the diode arrays. In some example embodiments, a personnel safety system may be coupled to the pulser crate 120. The personnel safety system may provide a permissive control input to pulser crate 120. For example, unless an affirmative safety signal is received at pulser crate 120 from personnel safety system 157, pulser crate 120 may not provide current to the laser diode array 110.

In some embodiments of the system 100 as shown in FIG. 1A, electrical power for the pulser crate 120, pulse controller 140, and/or personnel safety system 157 may be provided by power supply 150. In some embodiments, the voltage and current of the power supply may be controlled by a front end processor included in the pulser crate 120. In some example embodiments, the front end may processor communicate with the power supply via an Ethernet interface, or any other communications interface. In some example embodiments, the power supply can be 15 KW, 125 V, 120 Ampere DC power supply.

Because the load on the power supply is a pulsed load, in some embodiments, surge suppressor 155 is inserted between the power supply 150 and the pulser crate 120 to reduce or limit load current transients due to the laser diode current pulses provided by the laser diode driver circuits. In some example embodiments, the surge suppressor 155 may protect the DC power supply and extend the life of the power supply.

The laser system 100 in FIG. 1A operates within a larger system such as a power plant or other system. An operator such as operator 159 may provide command and control of pulse controller 140 as well as one or more other components of optical system 100. For example, operator 159 may include a computer system such as a power plant computer system and/or a personal computer with a user interface and/or a supervisory control and data acquisition (SCADA) system. In some embodiments, the pulser crate is connected to a HAPLS integrated control system (ICS). The HAPLS ICS (also referred to herein as a pulse controller) may include supervisory software, a machine safety system, and/or a control data base and date archive. For example, the supervisory software may provide a digital description of the optical and current waveforms for one or more of the pulsers in the pulser crate.

Figure 1B:
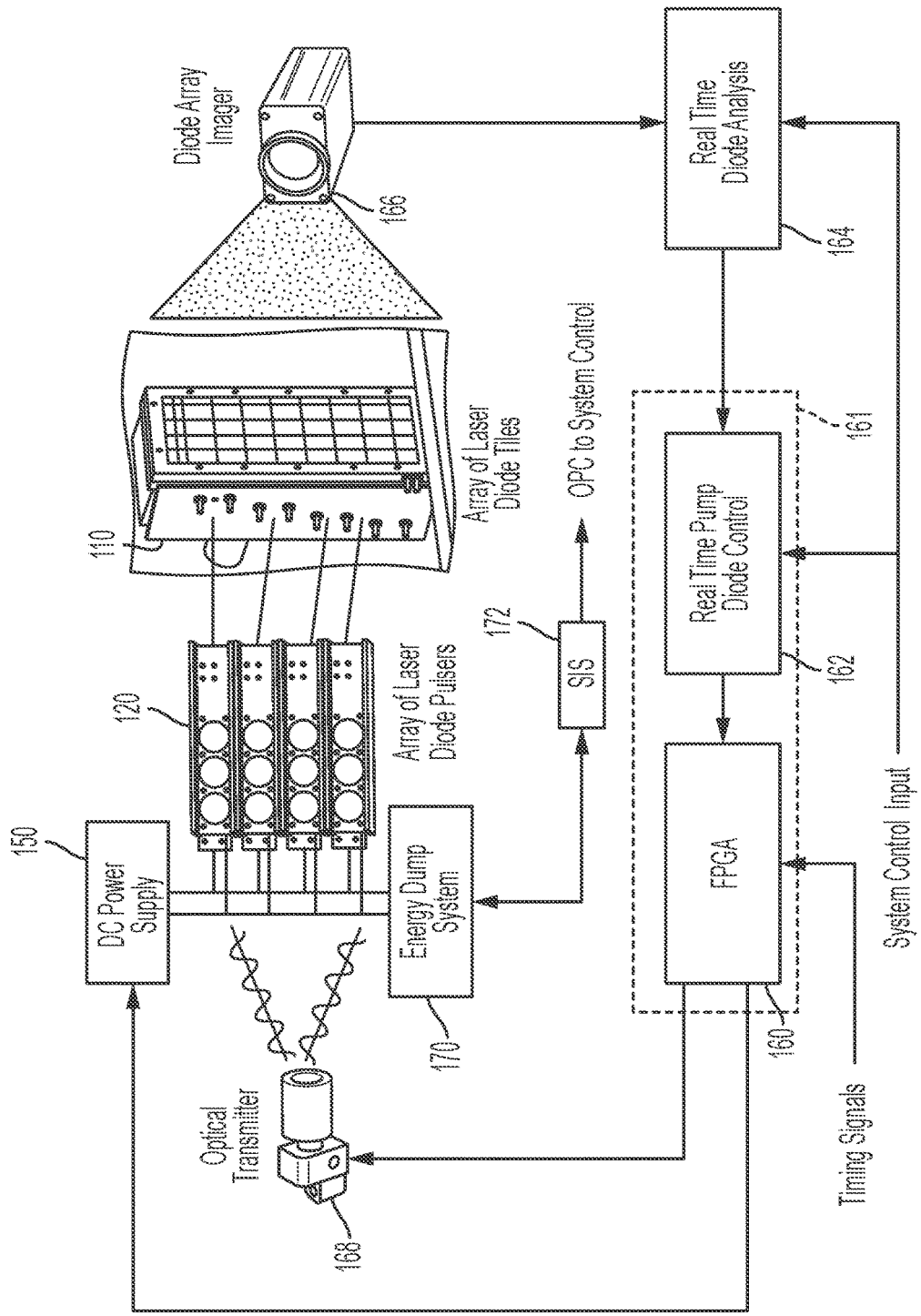
FIG. 1B depicts another example of a laser system including a laser diode array and laser diode driver electronics, in accordance with some example embodiments.

FIG. 1B depicts another example of a laser system including laser diode array 110, laser diode driver electronics 120, power supply 150, optical transmitter 168, diode array imager 166, real-time analyzer 164, real-time pump diode controller 162, field programmable gate array (FPGA) 160, energy dump system 170 and safety interlock system 172. Certain features of FIG. 1B are also contained in the system in FIG. 1A.

Laser diode array 110 may be driven by pulser crate 120 depicted in FIG. 1A via low-loss cables 130. Pulser crate 120 may include energy dump system 170 to cause the pulsers in pulser crate 120 to dump energy away from the laser diodes 110 due to a safety fault. Driving energy into laser diodes 110 may include driving the laser diodes 110 with electrical current pulses from energy stored in the pulsers from power supply 150. Energy dump system 170 may include a safety interlock system 172 to enable pulsing of the laser diodes 110 only when safety conditions are satisfied. For example, safety interlock system 172 may cause energy dump system 170 to prevent the pulser crate 120 from pulsing laser diodes 110 when mechanical safety covers are not in place over the laser diodes and driver electronics. Safety interlock system 172 may be part of, include, or be a subset of personnel safety system 157 in FIG. 1A. The safety interlock system (SIS) monitors the state of the personnel doors of the laser room, the state of upstream SIS systems, and the state of the operator control key, etc. The SIS system is the primary control of personnel access to the laser.

Real time controller 161 may communicate with pulser crate 120 via optical communication. For example, optical transmitter 168 may send command information to an optical receiver (see FIG. 1A, not shown in FIG. 1B) in pulser crate 120 to control the amplitude and/or timing of one or more of the pulsers in pulser crate 120. Optical transmitter 168 may also include an optical receiver to receive data from pulser crate 120. For example, pulser health and status information from one or more of the pulsers in pulser crate 120 may be received at 168. An optical receiver in pulser crate 120 receives the commands transmitted by optical transmitter 168. The received commands may cause changes to the attributes of one or more of the pulsers (see, for example, FIG. 4). The optical receiver in pulser crate may include an optical transmitter to transmit health and status information regarding the pulsers to 168 and real-time controller 161. Although the foregoing transmitter 168 and the corresponding receiver in the pulser crate are optical, any other type of communications devices may be used instead of or in addition to the optical communication described above. For example, radio frequency communication, and/or ultrasonic communication, wired communication, or any other type of communications device may be used to communicate between pulser crate 120 and real-time controller 161.

Real-time controller 161 may include a field-programmable gate array (FPGA) 160 and/or real-time pump diode controller 162. A diode array imager 166 may generate images of the diode array. Real-time diode analyzer 164 may analyze the images to determine if one or more of the laser diodes in the array are producing a predetermined light output intensity and temporal profile. Based on the analyzed images, adjustments to the current profile (wave shape) and pulse timing may be adjusted by 162. FPGA 160 may generate signals to dive optical transmitter 168 to cause the changes to the wave shape, current level, and/or timing of one or more pulsers. For example, one of the laser diodes may age causing the diode to be less efficient thereby requiring a higher current level than other laser diodes that have not aged. The corresponding reduced optical intensity may be detected by diode array imager 166, analyzed by analyzer 164, the current level may be adjusted by diode controller 162 and the higher current level transmitted to the pulser corresponding to the aged laser diode to cause the laser diode to produce the predetermined intensity. In some example embodiments, a diode array imager and real-time analyzer may be used to adjust the current amplitude and pulse shape for each laser diode individually to cause a predetermined optical output of the laser diode array. For example, the peak current and current wave shape may be adjusted for one or more laser diodes to cause a predetermined optical amplitude profile across the array.

Figure 2:
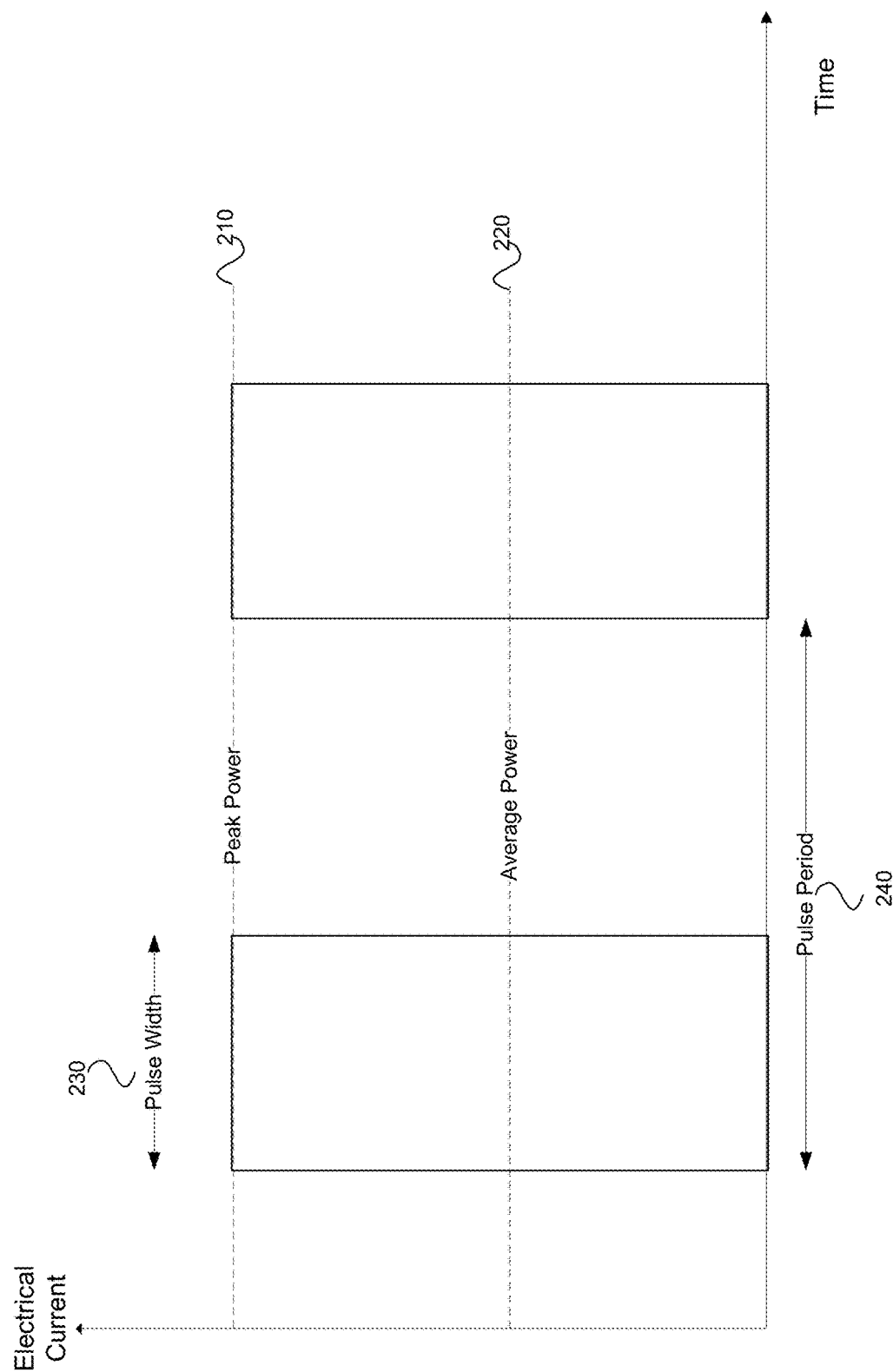
FIG. 2 depicts an example plot of electrical current delivered to a laser diode as a function of time, in accordance with some example embodiments.

FIG. 2 depicts an example of an electrical current delivered to a laser diode as a function of time, in accordance with some example embodiments. The description of FIG. 2 also includes features from FIGS. 1A and 1B. The exemplary current includes an example peak current 210, an average current 220, a pulse width 230, and a pulse period 240. Sample values and ranges are provided in FIG. 4. When a laser diode is periodically pulsed, one parameter used to characterize the pulses is the number of pulses per second, or the frequency of pulses, alternatively known as the pulse repetition rate (PRR). In accordance with FIG. 4, an example of a peak current includes 150 Amps, or 1000 Amps with a pulse width of 25 microseconds. In the foregoing example, the peak current and pulse width may be determined by the real-time controller 161 and/or pulse controller 140 and communicated to the pulser crate via optical transmitter 168. The foregoing values are exemplary. Any other current values may be used or pulser attributes adjusted.

Figure 3:
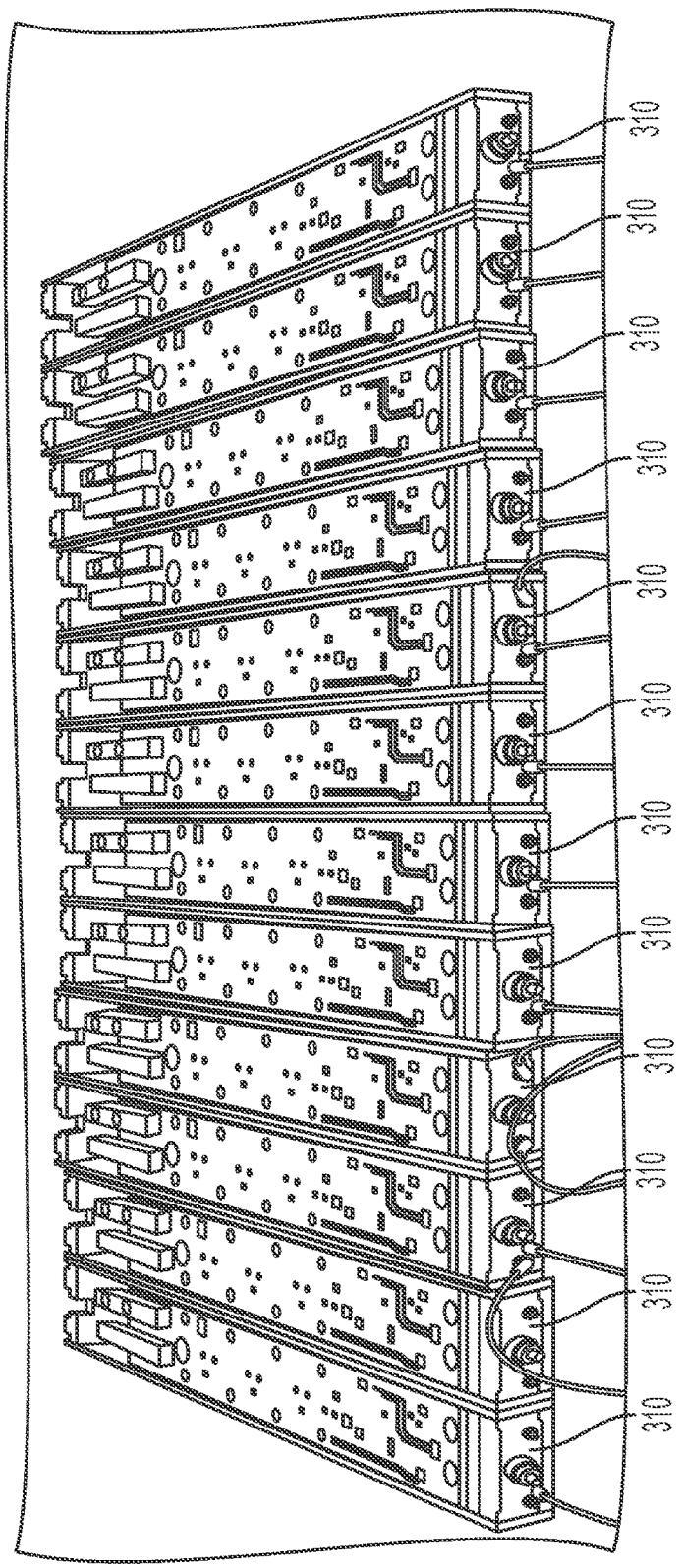
FIG. 3 depicts an example of a set of laser diode driver circuits, in accordance with some example embodiments.

FIG. 3 illustrates a top view of an array of 12 pulsers with their top covers removed. The description of FIG. 3 also includes features from FIGS. 1A, 1B, and 2. Each pulser may include an internal microcontroller to control the internal operation of the pulser and receive commands from the pulser crate. The microcontroller at each pulser can control the wave shape of the current provided to the laser diode corresponding to each pulser. The rise time, fall time, pulse amplitude, and pulse width of each laser diode may be controller in this way. In some example embodiments, the pulse shape and amplitude can take any form within in accordance with FIG. 4. In response to communication from the pulser crate, the microcontroller in each pulser can generate a current waveform for its corresponding laser diode. In this way the current waveforms for the different laser diodes can be different to account for differences between the laser diodes such as aging.

FIG. 4 depicts some attributes that may be adjusted in each pulser. The description of FIG. 4 also includes features from FIGS. 1A, 1B, 2, and 3. In some example embodiments, as shown in FIG. 4, the pulse shape control may be provided by an arbitrary waveform generator (AWG) that may shape the pulses provided by the laser diode pulser. The arbitrary waveform generator allows for the shape of the current pulse to be tailored for each laser diode to improve laser performance, system efficiency, and diode protection. Examples of attributes listed in FIG. 4 that can be adjusted at each pulser include the pulse current, pulse width, and pulse shape. Many other attributes can be adjusted or changed in each pulser.

Figure 5A:
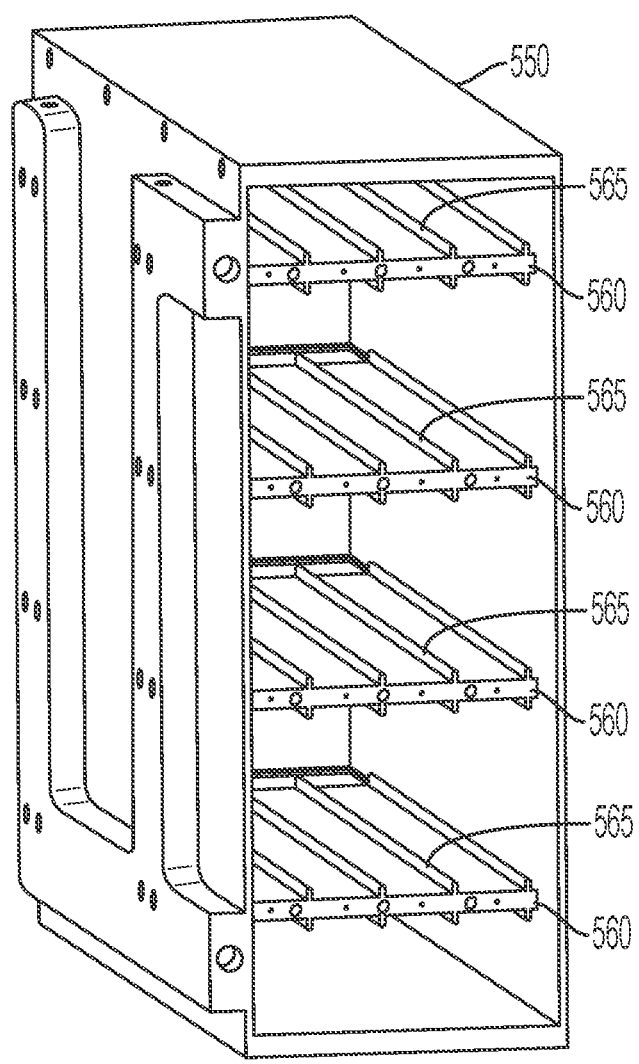
FIG. 5A depicts an example of a fixture for holding and cooling multiple laser diode driver circuits, in accordance with some example embodiments.

FIG. 5A depicts an example of fixture 500 for holding and cooling multiple laser diode driver circuits (pulsers), in accordance with some example embodiments. The description of FIG. 5A also includes features from FIGS. 1A, 1B, 2, 3, and 4. Fixture 500 may include internal channels in which fluid flows to cool the surfaces. Pulsers that are held in the fixture are cooled to prevent the pulsers from overheating. Fixture 500 includes cooling plates 560. Fluid flowing in plates 560 cools the top and bottom surfaces of the plates. Accordingly, pulsers may be placed on the top and bottom of each cooling plate 560. Guides 565 enable pulser to be held in fixture 500. In the example of FIG. 5A, eight rows of four pulsers for a total of 32 pulsers may be held by fixture 500.

Figure 5B:
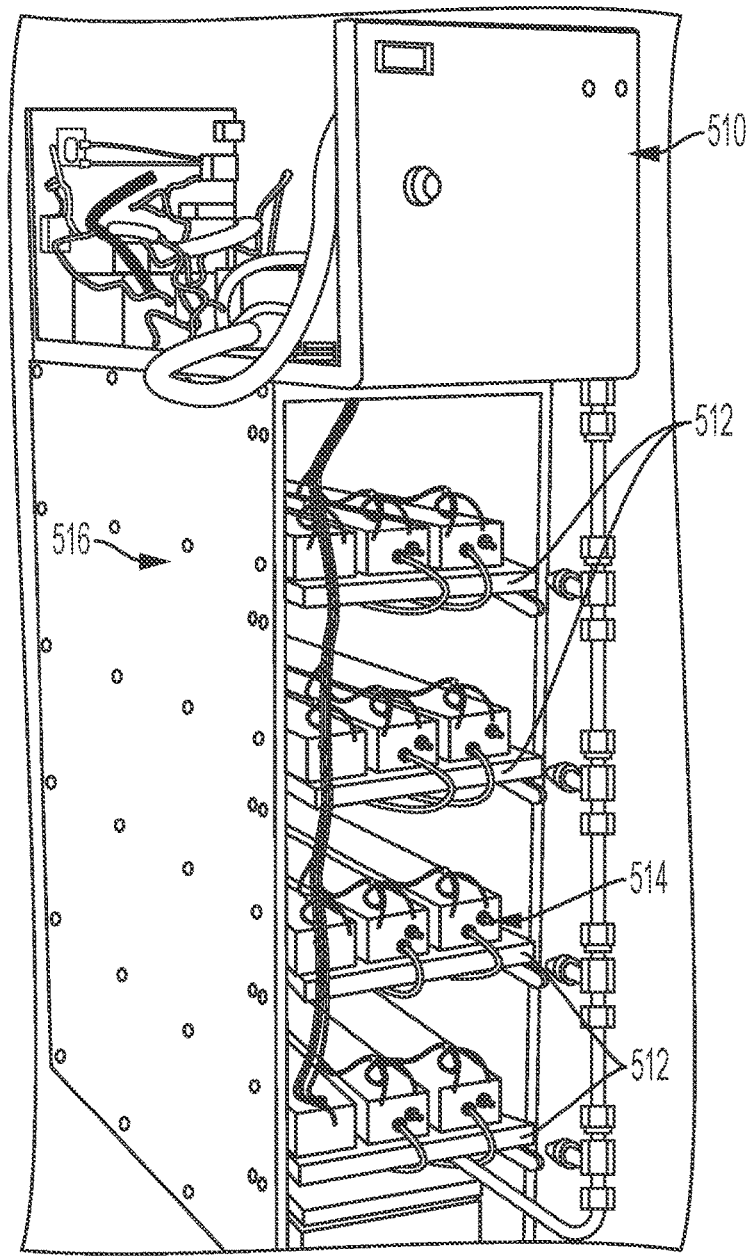
FIG. 5B depicts an example of an assembly including multiple laser diode driver circuits, in accordance with some example embodiments.
Figure 5C:
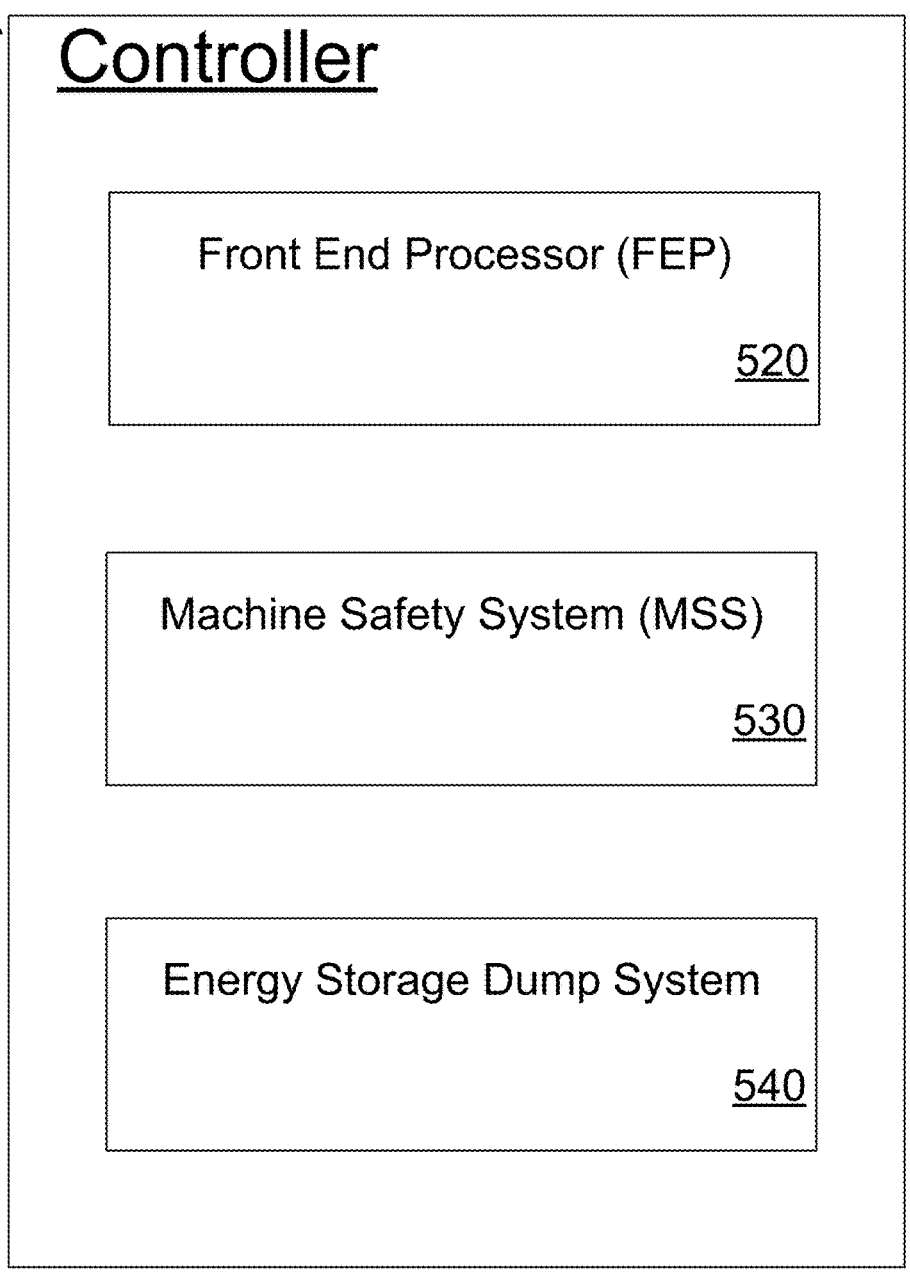
FIG. 5C depicts an example diagram of a controller, in accordance with some example embodiments.

FIG. 5B depicts an example of an pulser crate fixture including multiple pulsers, in accordance with some example embodiments. The description of FIG. 5B also includes features from FIGS. 1A, 1B, 2, 3, 4, and 5A. Each pulser crate fixture can include a pulser crate (housing multiple pulsers) 516, a controller 510, cooling plates 512, and optical receivers 514. In some example embodiments, pulsers can be mounted on their bases to the pulser crate, as shown in FIG. 5C. In some applications, a pulser can be mounted on either side to the pulser crate. Each pulser crate can be designed to house from one pulser to 45 pulsers or more. As an example, the pulsers may be mounted to a surface of the crate using high density surface technology. In some example embodiments, to provide for safety against high voltages, a plastic (e.g., Lexan, plastic, or other insulating material) enclosure may surround the pulser crate and the diode array. Each pulser may conduct its waste heat to the body of the pulser. For example, heat from the components included in the pulser may be transferred to the body of the pulser, which in turn is cooled using a set of cooling plates 560 or heat exchangers (not shown). The disclosed pulsers and fixture increase the reliability and compactness of the pulser crate assembly. Thus, in some implementations, one or more pulsers are mounted on top of cooling plates 512. In some embodiments, cooling plates 512 can be water-cooled plates that are a part of the crate's mechanical structure. In some example embodiments, pulsers can be mounted on both sides of the cooling plates (as described with respect to FIG. 5A) using front and rear "toe clips" to securely hold each pulser in place. For example, the "toe clips" to may exert pressure pressing the pulser heat surface against the cooling plate surface. The pressure exerted by the toe clips can be maintained between 10 and 50 psi to enable heat conduction from the pulser into the set of cooling plates 512. In some example embodiments, the temperature of the diode array is maintained below room temperature. Accordingly, to prevent condensation of water on the laser diodes and electrical connections (which would cause damage and safety hazard), condensation protection may be provided by an enclosure seal (e.g., Lexan or other insulating material) to the pulser crate and the diode array. In some embodiments, dry air may be circulated in the rear of the diode array, which can be kept open to allow for ready connection of electrical power.

Figure 6A:
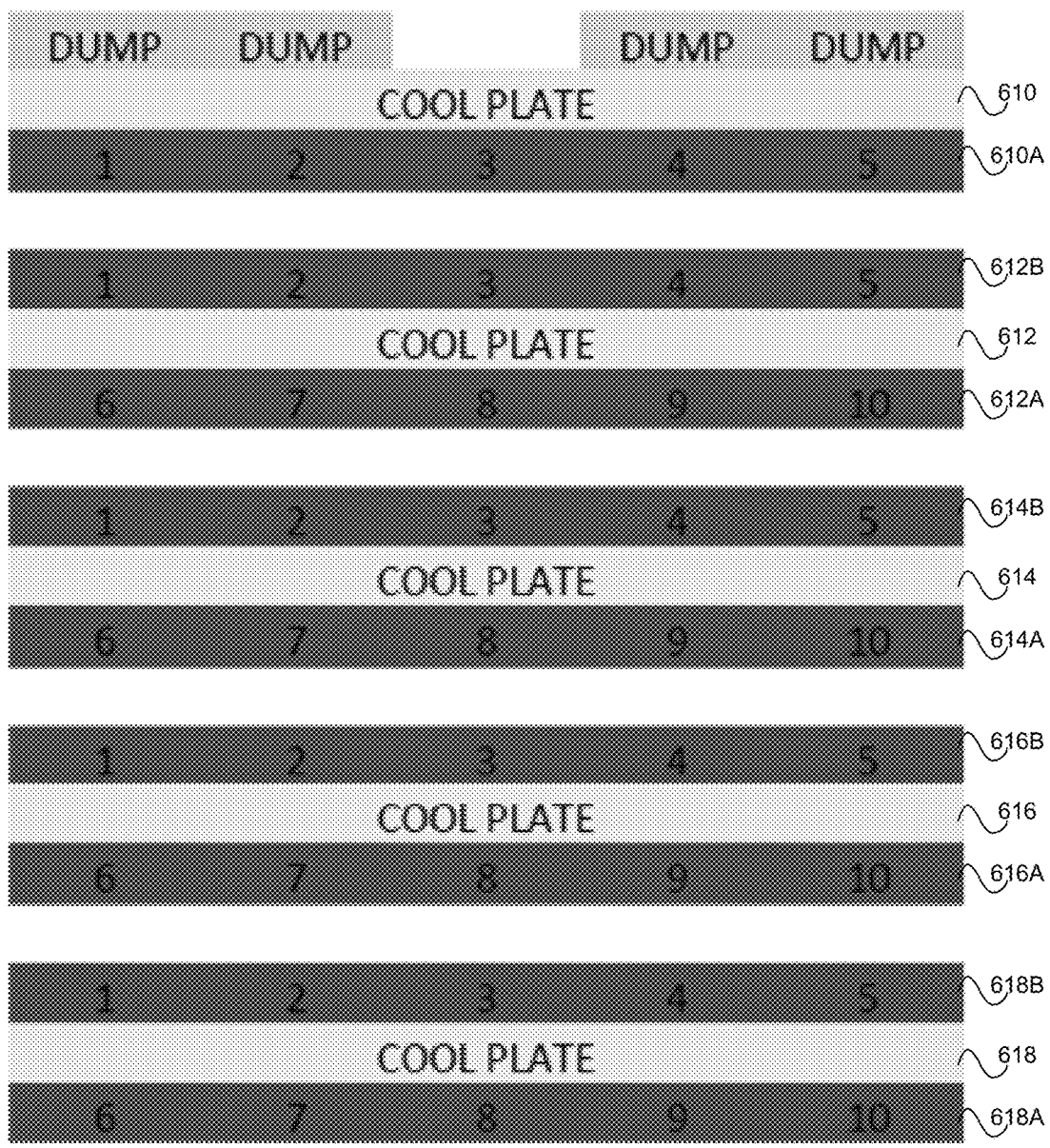
FIG. 6A depicts an example of an arrangement of laser diode driver circuits and cooling plates, in accordance with some example embodiments.
Figure 6B:
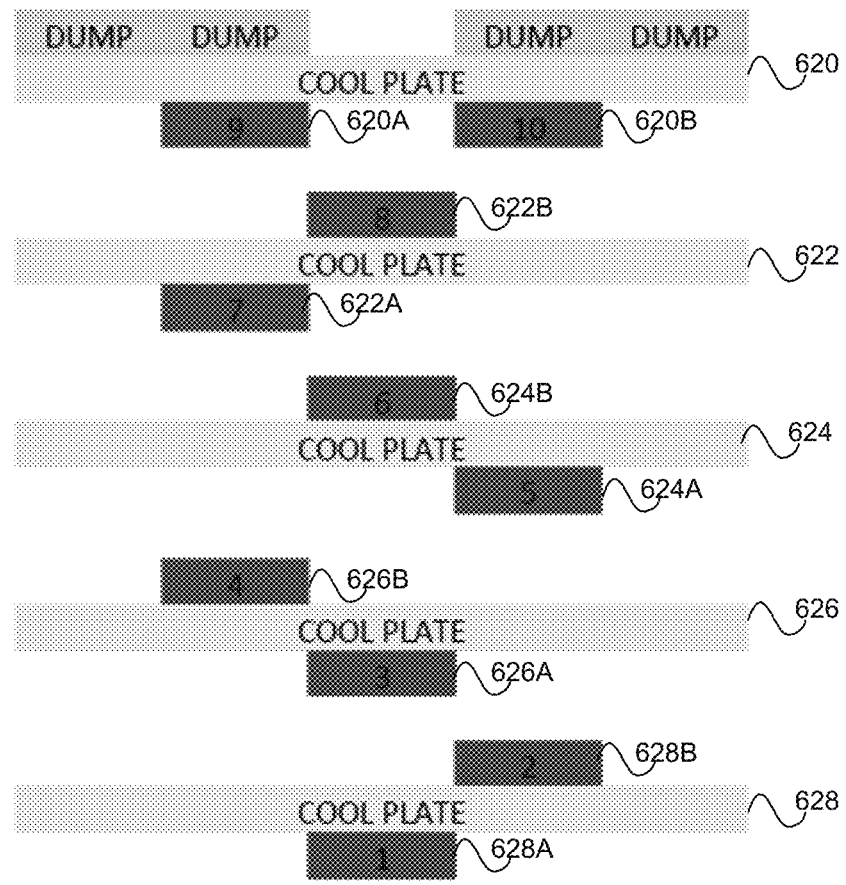
FIG. 6B depicts another example of an arrangement of laser diode driver circuits and cooling plates, in accordance with some example embodiments.

In some example embodiments, a thermal interface material (TIM) is applied to the surface of a pulser that is in contact with a cooling plate to facilitate heat transfer from the pulser body to the cooling plate. The TIM can be a semi-flexible material that can be re-used even when crate configurations change. Examples of different crate configurations are shown in FIGS. 6A and 6B.

In some example embodiments, diode pulsers in a crate may be triggered at the same or nearly the same time. Each pulser mounted in the crate may receive an optical data stream from the pulser crate via a set of optical receivers 514, as shown in FIG. 5B. In some example embodiments, the optical data stream is an optical signal transmitted at a frequency of 1 MHz. Other frequencies can also be used. Each pulser may have a unique address for receiving optical signals from the crate. In some example embodiments, pulsers may also respond to a broadcast (e.g., "listen all") address from the crate. Thus, each pulser may be individually programmed for current pulse shape, amplitude, etc. One or more pulsers in the crate may be triggered at the same or nearly the same time as other pulsers in the crate.

In some example embodiments, the pulser crate may include a metal (e.g., aluminum or other metal) fixture approximately the size of a large desktop computer. In some example embodiments, the pulser crate may route DC power to the pulsers using a copper bus bar system. This bus bar system allows for quick installation and removal of the pulsers. In some example embodiments, a 24V DC power supply may be used to power the crate and pulsers (sometimes referred to as housekeeping power).

FIG. 50 depicts an example diagram of a pulse controller 510 included in a pulser crate, in accordance with some example embodiments. The description of FIG. 5C also includes features from FIGS. 1A, 1B, 2, 3, 4, 5A, and 5B. Pulse controller 510 can include one or more front end processors (FEP) 520, a machine safety system (MSS) 530, and/or an energy storage dump system 540. (MSS 530 is also referred to herein as machine safety module.) Processor(s) 520 can include any processor(s). For example, processors 520 may include a NATIONAL INSTRUMENTS (NI) CRIO processor with an integrated FPGA and programmed with NATIONAL INSTRUMENTS LABVIEW. For example, in one example embodiments, FEP 520 may include the NI CRIO-9076 integrated 400 MHz Real-Time Controller and LX25 FPGA.

In some embodiments, FEP 520 may communicate with the upstream integrated control system (e.g., pulse controller shown in FIG. 1A) over Ethernet using the asynchronous message communications (AMC) and/or network streams communications protocols, or any other communication protocol. For example, FEP 520 may receive configuration information from the pulse controller 140 so that the diode arrays can be operated in a manner consistent with the configuration of the laser array as well as be consistent with other diode arrays in the overall system. The pulse controller can include a desktop computer running LabVIEW or any other computing system. (i.e., SCADA) For example, the pulse controller 140 may provide digital data representative of predetermined optical and current waveforms for the pulsers in the pulser crate.

In some embodiments, FEP 520 may control real time tasks associated with operating the pulser crate. These tasks can include control of the power supply (e.g., 150 in FIG. 1A) used to provide power to the crate, generation of the optical data stream used to control the pulsers, configuration of the machine safety system (included in the pulser crate) and monitoring of the crate sensors. In some example embodiments, FEP 520 may generate an optical data stream for communicating with one or more pulsers in the crate. In some embodiments, the communications are in accordance with configuration information received from the pulse controller 140. In some embodiments, a pulser may include one or more transmitters (not shown in FIG. 5C) for communicating the pulse shape and other pulser attributes, back to pulse controller for feedback purposes.

In some example embodiments, the pulser crate may include one or more sensors. The sensors may be monitored determine if the pulsers are operating within predetermined parameters. In some example embodiments, FEP 520 may monitor the parameters and report back to the pulse controller for archiving and in the event of an anomaly.

In some embodiments, FEP 520 may provide trigger timing signals (also referred to herein as trigger signals) for triggering the pulsers in the crate. Upon receiving a trigger signal, each pulser within a crate can generate a waveform. The riggers may be internally generated or generated in response to an external source. The use of an external trigger allows for multiple pulser crates to be time synchronized. Internal triggers may be synchronized to an external source. Internally generated triggers may be generated by the FEP and therefore may not be time coordinated with other crates. Externally generated triggers may come from a system wide timing system and each crate may respond in an identical fashion so that multiple crates can be time synchronized to within the resolution of the timing system.

As shown in FIG. 5C, controller 510 includes, a machine safety system (MSS) 530, among other components. In some embodiments, MSS 530 is implemented in the FPGA portion of FEP 520 and may cause the pulser crate to shut down in the event of an anomaly. For example, MSS 530 may receive feedback information relating to the measured current and optical output waveforms. Thus, in some implementations, in addition to current waveforms, a photo diode or other suitable detector may provide feedback of the optical waveforms to controller 510 and MSS 530.

In addition to, or in lieu of, the sensors included in a pulser crate, a diode array can also include sensors. In some example implementations, data generated from sensors within a crate as well as data from diode array sensors may be digitized and evaluated at a predetermined rate (e.g., 10 Hz rate). The data may be passed via an Ethernet interface. For example, data from these sensors may be evaluated against set points (e.g., thresholds or alarm/warning levels) provided by the pulse controller. In some example embodiments, the set points are predetermined. In some embodiments, the set points are configurable. When a set point exceeds (or is below) the alarm limit or threshold, pulser operations may be stopped and a hardware line is activated that is monitored by MSS 530 so that additional actions can be taken to protect the laser system. In some embodiments, the monitor and control of MSS 530 may be performed by the FPGA without requiring processor intervention which increases reliability. For example, the sensors can monitor the diode coolant temperature, the diode flow switch, the diode humidity, the pulser coolant flow rate, the pulser outlet temperature, the voltage of the power supply, and the like. In some implementations, the coolant flow rate per crate is maintained above 2.5 gallons per minute or above 3 gallons per minute for removal of heat such that temperature rises are limited to less than 5 degrees Celsius. In some example embodiments, when the flow rate is below 2.5 gallons per minute, or the flow rate is too high, or when the temperature rise is greater than 5 degrees Celsius, the MSS may shut down the local crate and provide a signal to the system MSS which may shut down the entire laser system.

In some embodiments, controller 510 includes an energy storage dump system 540. Energy storage dump system 540 may function as the energy system for one or more of the energy storage devices in the pulsers. The dump system can be activated by an external personnel safety signal tied to a safety interlock system (SIS) or by the internal MSS system which is also tied to the overall laser MSS system. The dump system is designed to remove the energy from the capacitors in the individual pulsers. There is one dump system per crate that services the pulsers in that crate. In the event of either a SIS fault (personnel safety) or an MSS fault (machine safety) the dumps are engaged and the energy in the pulsers in the crate are routed to a set of resistors and the energy is dissipated as heat into the crate cooling system. In addition, the dump system forces the external power supply to 0 volts. In order for the crate to resume operation, the fault that caused the dump to engage must be resolved followed by a dis-engagement before the operations are restarted.

FIGS. 6A and 6B illustrate different pulser configurations. The description of FIGS. 6A and 6B also include features from FIGS. 1A, 1B, 2, 3, 4, 5A, 5B, and 5C. For example, FIG. 6A depicts 45 pulsers arranged in a nine by five array. Five pulsers are positioned on each side of five cooling plates (9 sides of the 5 cooling plates). The dump system may be positioned on the tenth side. For example, pulsers 610A and the dump system are attached to cooling plate 610, pulsers 612A and 612B are attached to cooling plate 612, pulsers 614A and 614B are attached to cooling plate 614, pulsers 616A and 616B are attached to cooling plate 616, and pulsers 618A and 618B are attached to cooling plate 618. In an example implementation of FIG. 6A, the pulsers may produce a pulse width of 350 microseconds, a peak current of 520 Ampere, a 10 Hz pulse repetition rate, with an average current consumption of 2 Amps per pulser. In this example, the waste heat generated by pulser configuration may be about 52 Watts per pulser, or approximately about 2.4 KWatt per crate. In some implementations, the stored energy may be between 3.1 kJoule and 4.75 kJoule. Other pulse widths, with other peak currents, repetition rates, and average current consumption that produce other values of waste heat may also be implemented in the pulser configuration of FIG. 6A.

FIG. 6B depicts another configuration of 10 pulsers. The current pulse generated by the pulser configuration of FIG. 6B, may have a pulse width of 300 microseconds, a peak current of 315 Amps, a 120 Hz pulse repetition rate, and an average current consumption of 12 Ampere per pulser. The waste heat generated by this configuration is about 162 Watts per pulser, or approximately about 1.6 kWatts per crate. The stored energy may be about 1.05 kJoule. FIG. 6B also shows the relative placements of the cooling plates and the energy storage dump system dump with respect to the pulsers. For example, pulsers 620A and 620B are attached to one side of cooling plate 620 and the dump system to the other side, pulsers 622A and 622B are attached to cooling plate 622, pulsers 624A and 624B are attached to cooling plate 624, pulsers 626A and 626B are attached to cooling plate 626, and pulsers 628A and 628B are attached to cooling plate 628. It will be understood that the number of pulsers in a specific pulser configuration are not fixed and can be modified to suit the needs of the laser system. Other pulse widths, with other peak currents, repetition rates, and average current consumption that produce other values of waste heat may also be implemented in the pulser configuration of FIG. 6B.

FIG. 7 illustrates example attributes of a pulser cable, in accordance with some example embodiments. The description of FIG. 7 also includes features from FIGS. 1A, 1B, 2, 3, 4, 5A, 5B, 5C, 6A, and 6B. The output of the pulser is provided as a pulsed voltage and current on a pulser cable to a laser diode. The attribute values in FIG. 7 are exemplary and a may be altered based on the predetermined peak current, voltage, and/or wave shape.

Figure 8A:
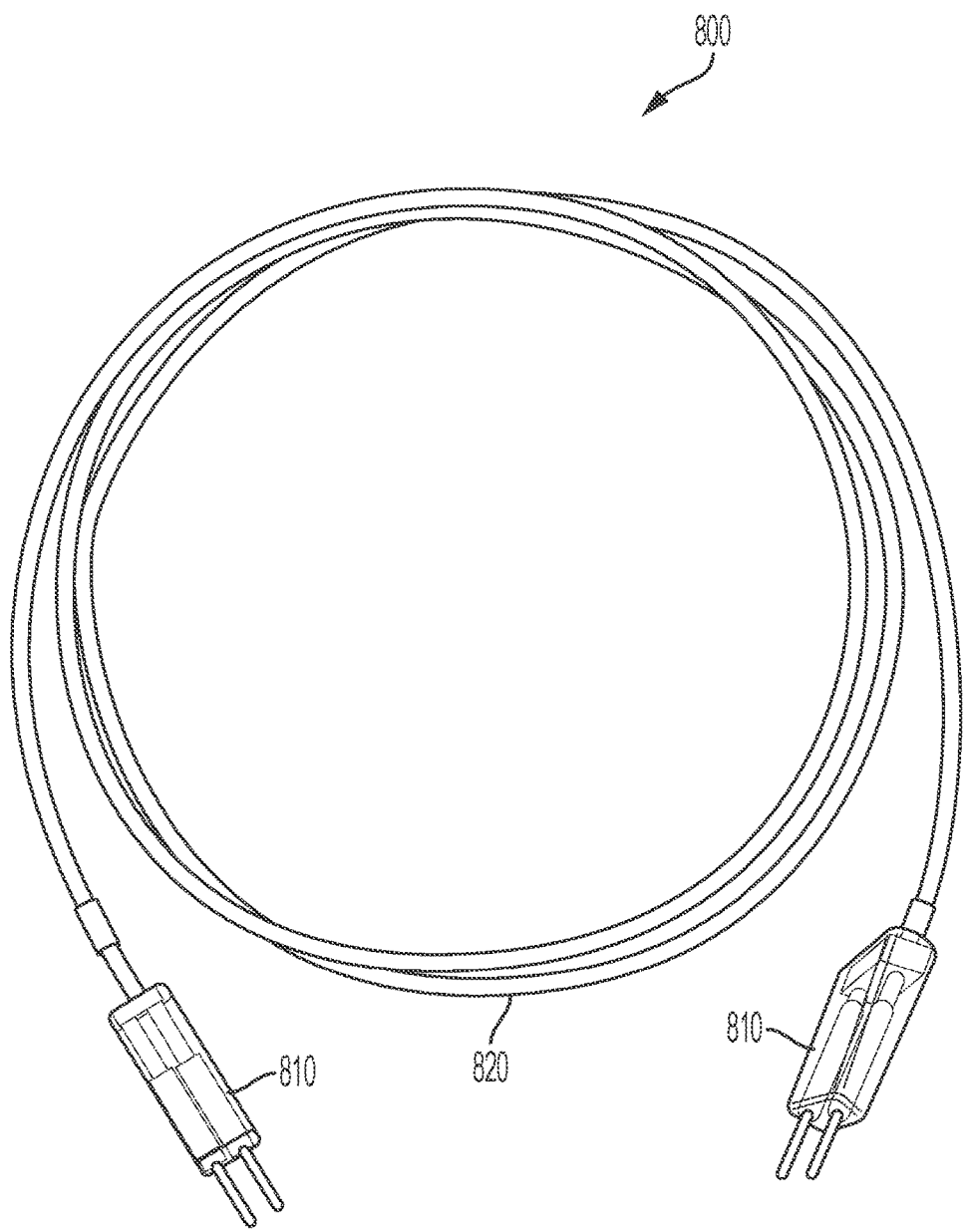
FIG. 8A depicts an example of a cable for driving a laser diode, in accordance with some example embodiments.
Figure 8B:
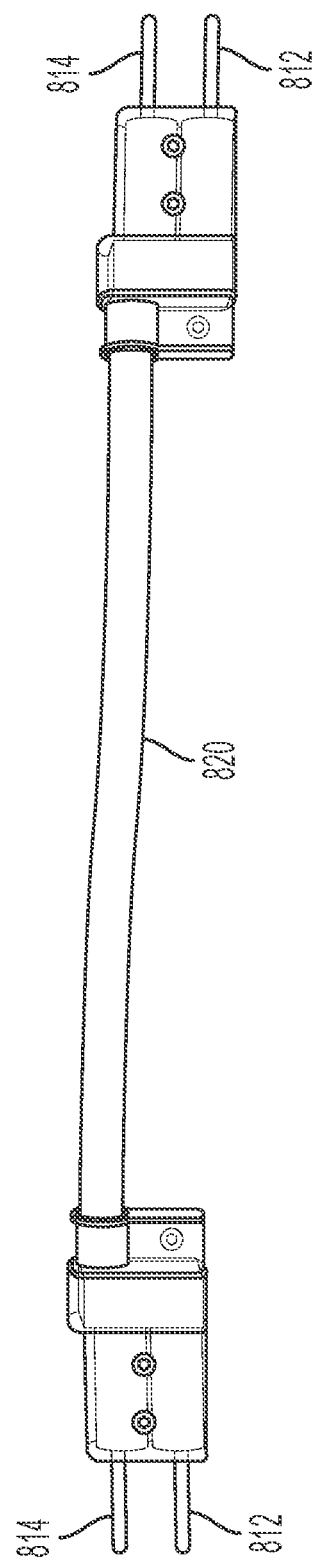
FIG. 8B depicts another example of a cable for driving a laser diode, in accordance with some example embodiments.
Figure 8C:
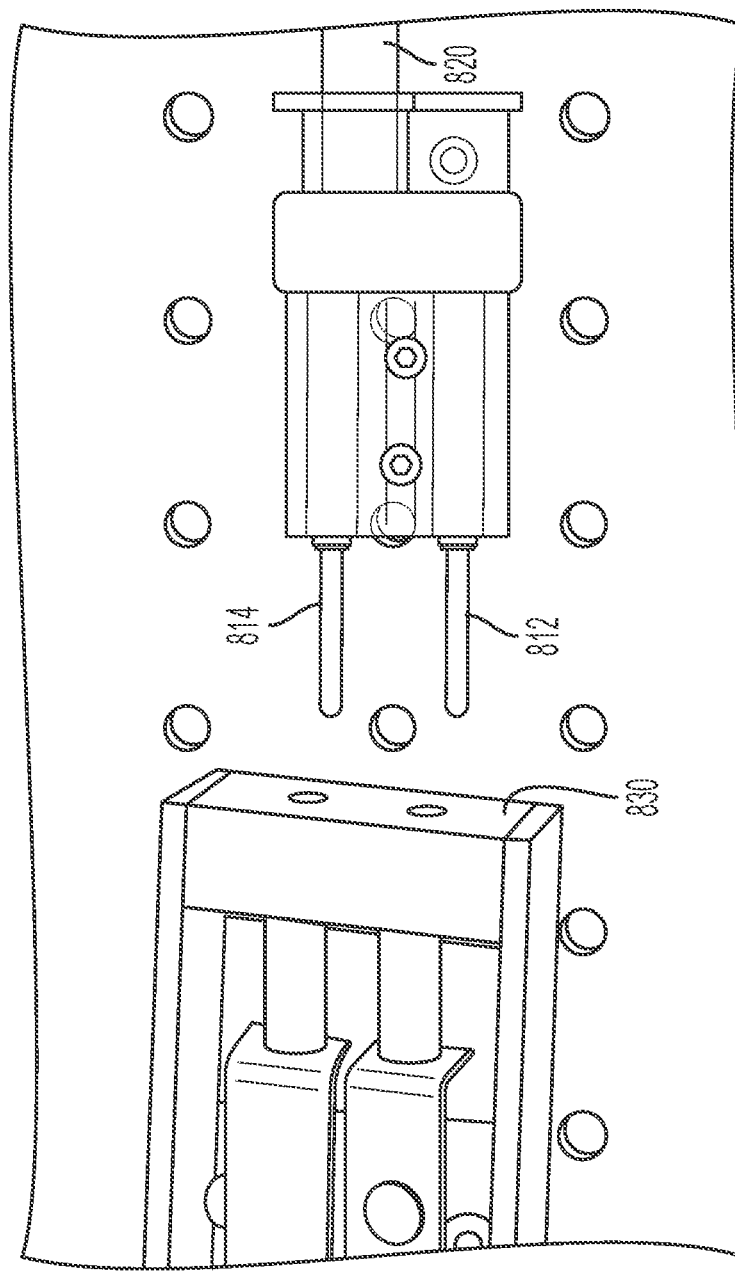
FIG. 8C depicts another example of a cable for driving a laser diode, in accordance with some example embodiments.

FIGS. 8A, 8B, and 8C illustrate embodiments of an example pulser cable 800 for connecting a pulser to a diode array. The description of FIG. 8 also includes features from FIGS. 1A, 1B, 2, 3, 4, 5A, 5B, 5C, 6A, 6B, and 7. Pulser cable 800 may include a polarized connector at each end of the cable 820. In some example embodiments, the pulser cable 820 may include a coaxial wire or cable (e.g., a Litz-like wire sized to carry the required current). The coaxial cable 820 may minimize the effect of electromagnetic interference. The connectors 810 are polarized so the cable can only be installed in one orientation (e.g., each pin of the connector and wire in the cable predetermined in polarity). For example, the male connector pins on the respective ends 810 of the cable can be male Multilam connectors (e.g., 4 mm and 5 mm in size). The male connector pins at each end of cable 800 are received by female connectors 830 on a pulser and a diode array. Although the pulse shape is controlled by the individual pulsers in the crate, the pulse shape can be affected by the cables used to connect the pulsers to the diode array. The disclosed pulser cables minimize changes to the wave shape due to the electrical characteristics of the cable 800. For example, pulser cable 800 including wire 820 and connectors 810 may have low resistance and low inductance. Example pulser cable attributes are shown in FIG. 7.

The subject matter described herein may be embodied in systems, apparatus, methods, and/or articles depending on the desired configuration. For example, the systems, apparatus, methods, and/or articles described herein can be implemented using one or more of the following: electronic components such as transistors, inductors, capacitors, resistors, and the like, a processor executing program code, an application-specific integrated circuit (ASIC), a digital signal processor (DSP), an embedded processor, a field programmable gate array (FPGA), and/or combinations thereof. These various example embodiments may include implementations in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "machine-readable medium" refers to any computer program product, computer-readable medium, computer-readable storage medium, apparatus and/or device (for example, magnetic discs, optical disks, memory, Programmable Logic Devices (PLDs)) used to provide machine instructions and/or data to a programmable processor, including a machine-readable medium that receives machine instructions. In the context of this document, a "machine-readable medium" may be any non-transitory media that can contain, store, communicate, propagate or transport the instructions for use by or in connection with an instruction execution system, apparatus, or device, such as a computer or data processor circuitry. A computer-readable medium may comprise a non-transitory computer-readable storage medium that may be any media that can contain or store the instructions for use by or in connection with an instruction execution system, apparatus, or device, such as a computer. Furthermore, some of the embodiments disclosed herein include computer programs configured to cause methods as disclosed herein.

Although a few variations have been described in detail above, other modifications or additions are possible. In particular, further features and/or variations may be provided in addition to those set forth herein. Moreover, the example embodiments described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. An apparatus for operating a plurality of laser diode arrays coupled to a laser pulser unit, comprising:
    a controller to control a current wave shape or a current amplitude driven into each laser diode in each of the laser diode arrays, wherein the controller is configured to adjust the current wave shape or the current amplitude for each laser in the laser diode array according to a command;
    a plurality of optical receivers coupled to the controller, the plurality of optical receivers configured to receive the command, wherein the command is a broadcast command to control the current wave shape or the current amplitude of a plurality of laser diodes together, or an addressed command to control the current wave shape or the current amplitude of one of the plurality of laser diodes;
    a plurality of driver circuits positioned inside the laser pulser unit and coupled to the plurality of optical receivers to receive the command from the controller, the plurality of driver circuits further coupled to the plurality of the laser diode arrays by a plurality of cables having a predetermined inductance characteristic, wherein an adjustment to the current wave shape or current amplitude includes a change in the current pulse shape or current pulse amplitude to compensate for the predetermined inductance characteristic in each of the plurality of cables; and
    a single energy discharge unit coupled to a fault detection system, the energy discharge unit comprising a plurality of resistors and configured to discharge energy stored in all driver circuits of the laser pulser unit through the set of resistors in response to receiving a signal indicative of an anomalous laser diode output current or output power from the fault detection system.

2. The apparatus of claim 1, wherein the controller is configured to at least:
    receive feedback information relating to a measured current into an associated laser diode and a measured optical output from the associated laser diode, and
    upon detecting an anomaly in the measured current or a measured optical output, adjust the current amplitude or wave shape via a command; and
    send the command to control the current amplitude or wave shape into the associated laser diode.

3. The apparatus of claim 2, wherein the wave shape is adjusted in at least one of:
    a rise time of a pulse;
    a fall time of the pulse;
    an amplitude of the pulse; or
    a width of the pulse.

4. The apparatus of claim 2, wherein the controller is configured to at least:
    monitor data from one or more sensors included in the apparatus.

5. The apparatus of claim 4, wherein the monitored data from the one or more sensors includes at least one of:
    a diode coolant temperature;
    a diode flow switch status;
    a diode humidity;
    a pulser coolant flow rate;
    a pulser outlet temperature; or
    a voltage provided by a direct current power supply.

6. The apparatus of claim 1, further comprising:
    one or more processors and memory, wherein the one or more processors is further configured to communicate via an Ethernet interface.

7. The apparatus of claim 6, wherein the one or more processors includes an integrated field programmable gate array.

8. A method for controlling a laser diode array, comprising:
controlling, by a controller, a current wave shape or a current amplitude driven into each laser diode in the laser diode array, wherein the controller adjusts the current wave shape or the current amplitude according to a command, wherein an adjustment to the current wave shape or current amplitude includes a change in the current pulse shape or current pulse amplitude to compensate for a predetermined inductance characteristic in each of a plurality of cables connecting a plurality of driver circuits to laser diodes in the laser diode array;
receiving, by a plurality of optical receivers coupled to the controller, the command, wherein the command is a broadcast command to control the current wave shape or the current amplitude of a plurality of laser diodes together, or an addressed command to control the current wave shape or the current amplitude of one of the plurality of laser diodes;
receiving a signal indicative of an anomalous laser diode output current or output power from a fault detection system; and
using a single energy discharge unit comprising a plurality of resistors to discharge energy stored in all driver circuits through the set of resistors in response to receiving the signal indicative of an anomalous laser diode output current or output power.

9. The method of claim 8, wherein the controller is configured to at least:
receive feedback information relating to a measured current into the associated laser diode and a measured optical output from the associated laser diode;
upon detecting an anomaly in the measured current or a measured optical output, adjust the current amplitude or wave shape via a command; and
send the command to control the current amplitude or wave shape into an associated laser diode.

10. The method of claim 9, wherein the wave shape is adjusted in at least one of:
a rise time of a pulse;
a fall time of the pulse;
an amplitude of the pulse; or
a width of the pulse.

\* \* \* \* \*